(12) United States Patent
Reddy et al.

(10) Patent No.: US 6,175,520 B1
(45) Date of Patent: Jan. 16, 2001

(54) NONVOLATILE MEMORY ARRAY HAVING LOCAL PROGRAM LOAD LINE REPEATERS

(75) Inventors: T. Damodar Reddy, San Jose; Abhijit Ray, Milpitas, both of CA (US)

(73) Assignee: Alliance Semiconductor Corporation, Santa Clara, CA (US)

( * ) Notice: Under 35 U.S.C. 154(b), the term of this patent shall be extended for 0 days.

(21) Appl. No.: 08/866,094

(22) Filed: May 30, 1997

(51) Int. Cl.[7] .................................................. G11C 11/34
(52) U.S. Cl. .............................. 365/185.08; 365/185.13
(58) Field of Search ......................... 365/185.08, 185.13

(56) References Cited

U.S. PATENT DOCUMENTS

| | | | |
|---|---|---|---|
| 4,999,812 | 3/1991 | Amin | 365/185 |
| 5,173,874 | 12/1992 | Kobatake | 365/185 |
| 5,398,203 | 3/1995 | Prickett, Jr. | 365/185 |
| 5,469,384 | * 11/1995 | Lacey | 365/185.13 |
| 5,495,442 | * 2/1996 | Cernea et al. | 365/185.03 |
| 5,553,020 | 9/1996 | Keeney et al. | 365/185.19 |

\* cited by examiner

Primary Examiner—David Nelms
Assistant Examiner—M. Tran
(74) Attorney, Agent, or Firm—Limbach & Limbach LLP

(57) ABSTRACT

A flash EPROM device (100) is disclosed. During a programming operation, a primary programming voltage circuit (116) drives I/O lines (110) to a programming voltage (Vp) according to input data values. Secondary programming voltage circuits (118) are located remotely from the primary programming voltage circuit (116) and further drive I/O lines to Vp in response to the voltage levels on the I/O lines. This arrangement reduces the effect on the load line response of the impedance intermediate the primary programming voltage circuit (116) and the secondary programming voltage circuits (118).

19 Claims, 5 Drawing Sheets

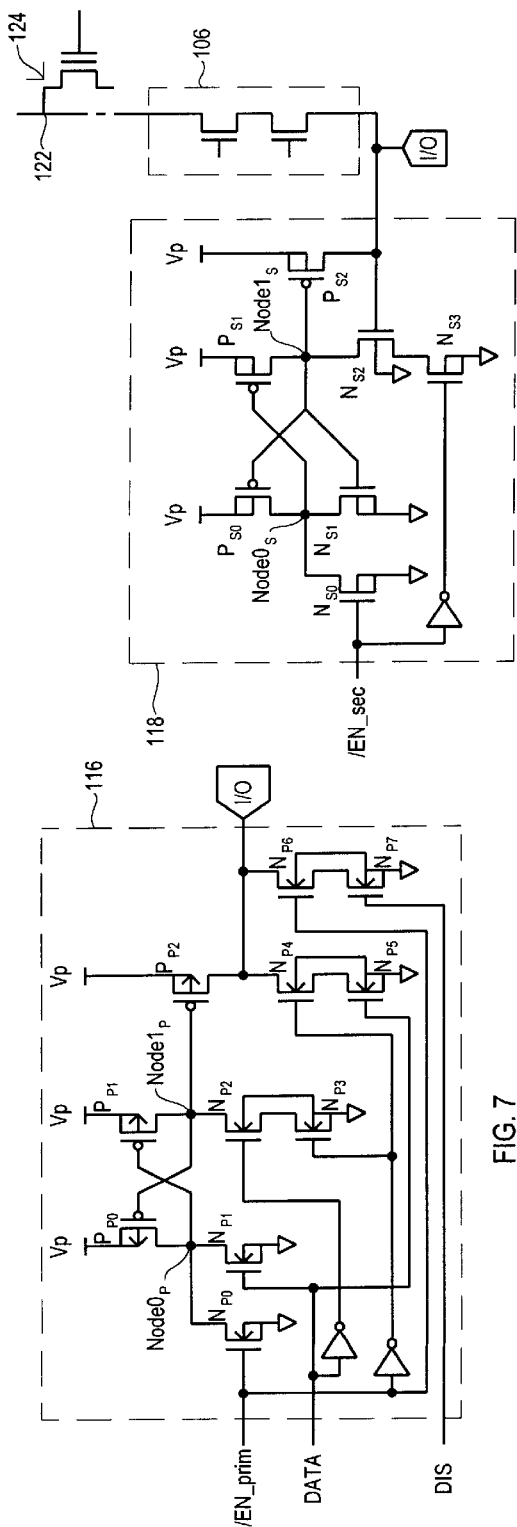
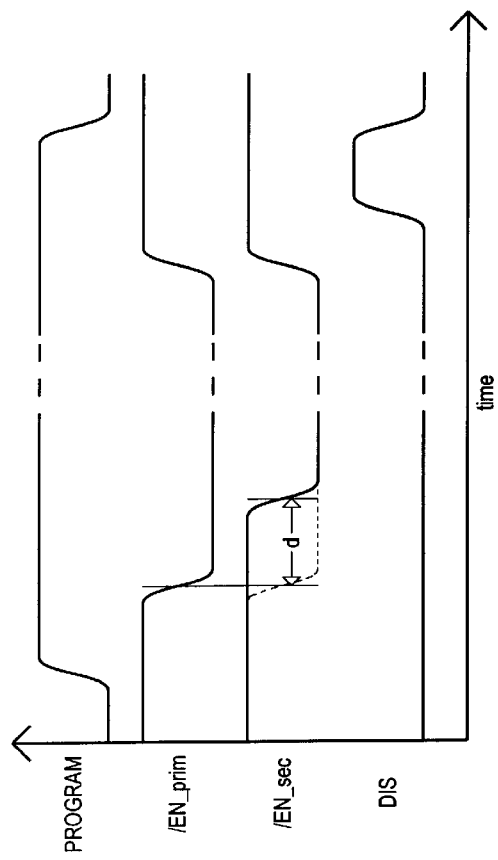
FIG. 8
FIG. 7
FIG. 9

NONVOLATILE MEMORY ARRAY HAVING LOCAL PROGRAM LOAD LINE REPEATERS

TECHNICAL FIELD

The present invention relates generally to nonvolatile semiconductor memory devices, and more particularly to circuits for applying a programming voltage to memory cells within such devices.

BACKGROUND OF THE INVENTION

Electrically programmable read-only memories (EPROMs) include "UVEPROMs," conventional EEPROMs, and "flash" EEPROMs (also referred as flash EPROMs). In all of the above type EPROMs, memory cells are programmed by applying selected voltages to the terminals of the memory cells. FIG. 1 sets forth a conventional one transistor ("1-T") EPROM cell. Cells of this general configuration are utilized in both UV-EPROMs and certain types of "flash" EPROMs. The 1-T cell is designated by the general reference character 1, and is shown to be formed on a semiconductor substrate 2 of p-doped silicon. The cell 1 includes an n-doped source region 3 and an n-doped drain region 4 formed within the substrate 2. A floating gate 5 and a control gate 6 are formed on the surface of the substrate 2. The floating gate 5 is separated from the substrate 2 by a thin dielectric layer (referred to herein as a tunnel dielectric 7). In addition, the floating gate 5 is separated from the control gate 6 by another dielectric layer (referred to herein as an interpoly dielectric 8, as both the floating gate and control gate are commonly formed from polycrystalline silicon). The cell 1 of FIG. 1 is shown in a typical program condition. A first program voltage (Vp) is applied to the drain 4, a second program voltage (Vpp) is applied to the control gate 6, and the source 3 is grounded. Vp and Vpp are typically positive voltages, with Vpp being in the range of 12V and Vp being in the range of 5V. Electrons are accelerated from the source 3 toward the drain 4, and due to the field created by Vpp on the control gate 6, injected through the tunnel dielectric 7 and into the floating gate 5. At the very start of the programming operation the cell 1 draws a relatively large amount of source-drain current, but as charge accumulates in the floating gate 5, the threshold voltage of the cell 1 rises, and this current drops in magnitude.

The cell current versus drain voltage relationship of a typical 1-T cell for a programming operation is set forth in FIG. 2. As shown in FIG. 2, the current (Ids) rises to a high point (a "knee" 20), and then drops suddenly as the cell is programmed. Also set forth in FIG. 2 is a representation of three different program "load lines" 21a–21c. The program load lines represent inherent impedance in the path from the program voltage source to the cell that is to be programmed. Load line 21a represents an undesirable case of a load line that is too high, and falls below the knee 20. In such a case the drain voltage will never be high enough to program the cell. Load line 21b represents a marginal load line; one that never falls below the knee 20, but is so close to the knee 20 that process variations may result in too high a load line for selected cells. Load line 21c represents a "good" load line that remains above the programming curve with sufficient margin to ensure proper programming of the cells.

To illustrate the origins of load line impedance, a portion of a prior art EPROM architecture is set forth in FIG. 3. The EPROM is designated by the general reference character 30, and is shown to include a number of memory cell arrays 31a–31d. Each memory cell array (31a–31d) includes a number of memory cells arranged in rows and columns. Within the array, cells in the same row are coupled to the same word line by their respective control gates, and cells in the same column are coupled to the same bit line by their respective drains. One cell 32, one word line 33 and one bit line 34 of array 31a are illustrated in FIG. 3. The EPROM 30 includes a program voltage source 35 for supplying a program voltage to selected memory cells. According to well understood techniques the program voltage source 35 can be a positive supply voltage, or an even higher voltage generated from a supply voltage by way of charge pumps circuits, or the like. The program voltage is coupled from the program voltage source 35 to column selectors (36a–36d) of each array (31a–31d) by data lines, one of which is shown as item 37 in FIG. 3. According to a supplied address, and input data stored in latch 38 the column selectors (36a–36d) couple the program voltage to selected bit lines, and thus to the drains of selected cells. The entire program voltage path from the program voltage source 35 to the drains of selected cells possesses an inherent impedance. The contacts, metallization(s) and/or diffusions included in the data lines all contribute to the impedance. In addition, bit lines and column selectors, particularly the active devices within the column selectors, further introduce impedance in the program voltage path.

Manufacturing technology improvements can also increase load line impedance. The use of lower supply voltages, smaller manufacturing geometries, and higher density devices, all contribute to the difficulty of providing an adequate load line response in programming EPROM devices. When used as the programming voltage, a lower supply voltage requires less load line impedance to adversely affect program operations, particularly if the cell programming characteristics cannot be scaled down in the same proportion. Smaller geometries can result in higher impedance interconnects, and higher impedance in active devices. Higher density devices can require longer interconnects to provide the programming voltage to the cells at the far end of the device, and thus introduce more impedance to the load line.

U.S. Pat. No. 4,999,812 issued to Allaaeldin Amin discloses a flash EPROM memory wherein a relatively high programming voltage for the cells of the memory is applied directly to the array by way of the flash EPROM cell sources. Such an approach can lead to faster read times, but may have some drawbacks in other modes of operation. It is noted that the Amin architecture includes a line impedance created by the path from the drain of the memory cells to ground. Further, the common source lines present a relatively large capacitive node, which can result in large discharge times.

U.S. Pat. No. 5,495,442 issued to Cernea et al. discloses an EEPROM with a "bit line voltage regulator" disposed between the bit line selection circuits and the bit lines. Programming voltage is supplied via sense amps through the bit line selection circuits. The path of the sense amplifier is interrupted in the case of an overvoltage condition on the bit lines.

U.S. Pat. No. 5,173,874 issued to Hiroyaki Kobatake discloses an EPROM in which a programming voltage (Vpp) is supplied to write circuits (one write circuit for each I/O). Separate interconnects are used to supply Vpp to write circuits and a voltage divider circuit, so that voltage drops introduced by interconnect are not introduced to the voltage dividing circuit.

U.S. Pat. No. 5,469,384 issued to Timothy M. Lacey on discloses a nonvolatile memory circuit that includes a load line circuit having two different impedance paths. One path is enabled to program one bit. A second, lower impedance path is used to program multiple (four) bits.

U.S. Pat. No. 5,398,203 issued to Bruce Prickett, Jr. discloses an EPROM programming circuit in which the current supplied to bit lines during programming is limited by a device in the load line that is placed into a linear mode of operation when bit line currents exceed desired levels.

U.S. Pat. No. 5,553,020 issued to Keeney et al. discloses a flash EEPROM device wherein the gate voltage is ramped to limit programming current.

FIG. 4 sets forth a prior art arrangement in which a combination of a local sense amplifier, program load circuit, and data latch are provided for each array. One array is designated as reference character 40. A column selector 41 is disposed adjacent to the array 40, and according to column select signals, couples bit lines in the array to local data I/O lines 42. Each local data I/O line 42 is coupled to a sense amplifier 43/program load circuit 44/latch 45 combination. Such an arrangement eliminates the majority of the load line impedance, but requires that valuable area be dedicated to the circuits next to the array for higher density EPROMs. Further, the sense amplifier/program load circuit/latch combination should be placed within the pitch of the local data I/O lines 42.

It would be desirable to be able to provide a programming voltage to EPROM cells in large density memories without having to be concerned with the effects of the architecture on the programming load line.

SUMMARY OF THE INVENTION

It is an object of the present invention to provide an EPROM memory device having a programming circuit with a low load line impedance.

It is another object of the present invention to provide a uniform programming voltage to all the memory cells of a high density EPROM memory device.

According to the present invention an EPROM memory device includes a primary program voltage supply circuit for providing a programming voltage to selected data I/O lines during a programming operation. A number of secondary program voltage supply circuits are coupled to the data I/O lines. The secondary program voltage supply circuits drive their respective data I/O lines to the program voltage in response to the primary voltage supply circuits driving the data I/O lines to the program voltage.

According to one aspect of the present invention the secondary program voltage supply circuits are enabled after the primary voltage supply circuits are enabled to prevent a false triggering of the secondary program voltage supply circuits, should glitches appear on the data I/O lines, for any reason.

According to another aspect of the present invention the primary program voltage supply circuits are located near respective sense amplifiers and data latches, and relatively remotely from a portion of memory cells in the device, and the secondary program voltage supply circuits are located proximate to said memory cells.

An advantage of the present invention is that it provides relatively uniform program load line response, regardless of the location of the memory cells in the array.

Another advantage of the present invention is that the EPROM memory device density can be increased without unduly affecting the program load line response.

Another advantage of the present invention is that reliable program load voltages can be supplied in multi-bit program test modes.

Another advantage of the present invention is that it allows for lower program voltage values by reducing voltage drops introduced by the device architecture.

Another advantage of the present invention is that it provides local program voltage supplies that do not require additional control signals to trigger.

Other objects and advantages of the present invention will become apparent in light of the following description thereof.

BRIEF DESCRIPTION OF THE DRAWINGS

FIG. 7 is a schematic diagram illustrating a primary program load circuit according to a preferred embodiment.

FIG. 8 is a schematic diagram illustrating a secondary program load circuit according to a preferred embodiment.

FIG. 9 a timing diagram illustrating the input signals to the primary and secondary program load circuits of FIGS. 7 and 8.

DETAILED DESCRIPTION OF THE EMBODIMENTS

Figure 2:
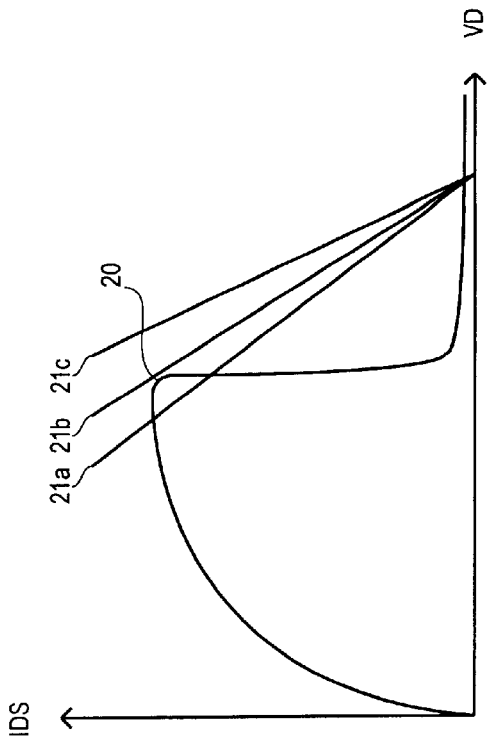
FIG. 2 is a graph illustrating the programming examples of "load lines" for an EPROM cell FIG.
Figure 1:
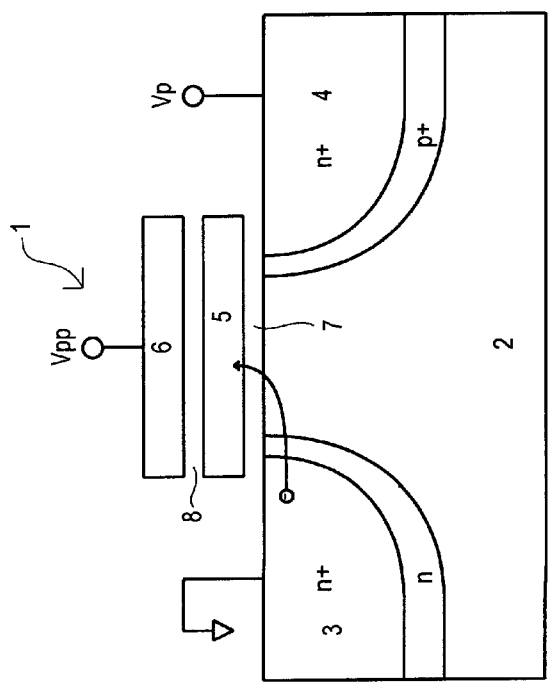
FIG. 1 is a side cross sectional view of a one transistor EPROM cell.
Figure 4:
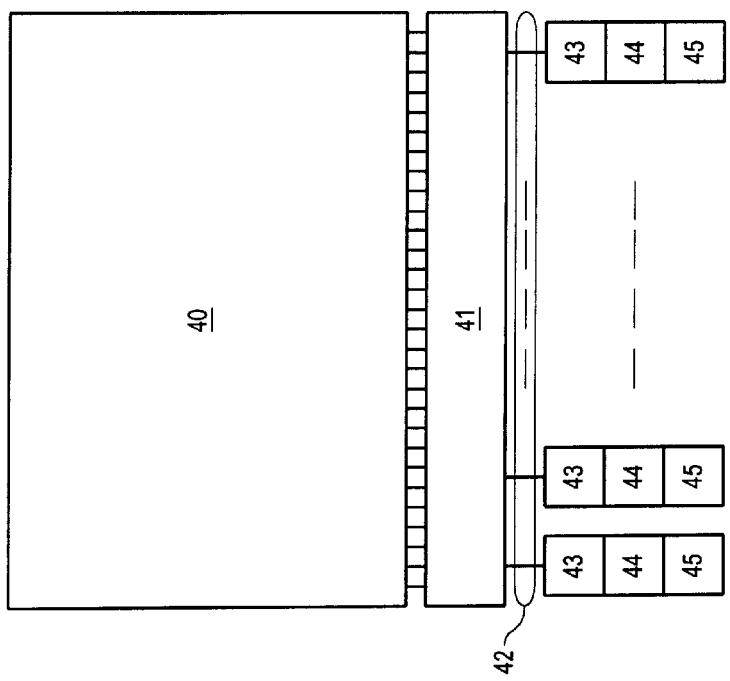
FIG. 4 is a block diagram illustrating a prior art EPROM memory device program and sensing architecture

The preferred embodiment of the present invention is implemented in a "flash" EPROM memory device. A portion of the memory device is set forth in FIG. 5 and designated by the general reference character 100. The memory device 100 includes a number of arrays 102a–102f, it being understood that each array includes a number 1-T nonvolatile memory cells, such as that set forth in FIG. 1. The cells are arranged in rows and columns, and in the particular arrangement of FIG. 5a, each array is logically divided, in the column direction, into eight I/O groups. The I/O groups of array 102a are illustrated by broken lines in FIG. 5a, and designated by the reference characters 104a–104h. Of course the particular number of I/O groups can be increased or decreased, and should not be construed as limiting the present invention.

Referring once again to FIG. 5a, a column selector 106a–106d and row decoder 108a–108f are associated with each array 102a–102f. According to well understood techniques, the row decoders 108a–108f drive selected wordlines in the array to predetermined voltages depending upon the current mode of operation (e.g., program, erase, or read). The particular row (or rows) driven is determined according to an externally applied memory address. The column selectors 106a–106d couple selected bit lines to data I/O lines 110a–110d. For example, either column selector 106a or column selector 106c couples bit lines to data I/O lines 110a. In the same manner, either column selector 106b or column selector 106d couples bit lines to data I/O lines 110b. It is understood that while the data I/O lines are labelled as four different groups, 110a–110d, each of the groups contains the same set of I/O lines (shown as I/O0–I/O7). In the particular embodiment of FIG. 5, there is a data line corresponding to the number of I/O groups (eight). The data I/O lines 110 form a data I/O bus 112 which is coupled to a bank of data latches 114, sense amplifiers 115, and program voltage supply circuits (referred to herein as a "primary load circuits") 116.

The present invention employs a number of local program voltage repeaters (referred to herein as "secondary load circuits") 118 to substantially reduce drops in, and variations between, I/O lines during programming. Each secondary load circuit 118 "locally" drives its respective I/O line to the programming voltage. In the particular embodiment of FIG. 5, the secondary load circuits are arranged in secondary load circuit sets 120a–120b. One set of secondary load circuits 120a is disposed between column selectors 106a and 106c, and is associated with the group of data I/O lines (110a) coupled thereto. In the same fashion, a set of secondary load circuits 120b is disposed between column selectors 106b and 106d, and is associated with the data I/O line group 110b. Two other sets of secondary load circuits (not shown in FIG. 5) are associated with data I/O line groups 110c and 110d.

Figures 5A, 5B:
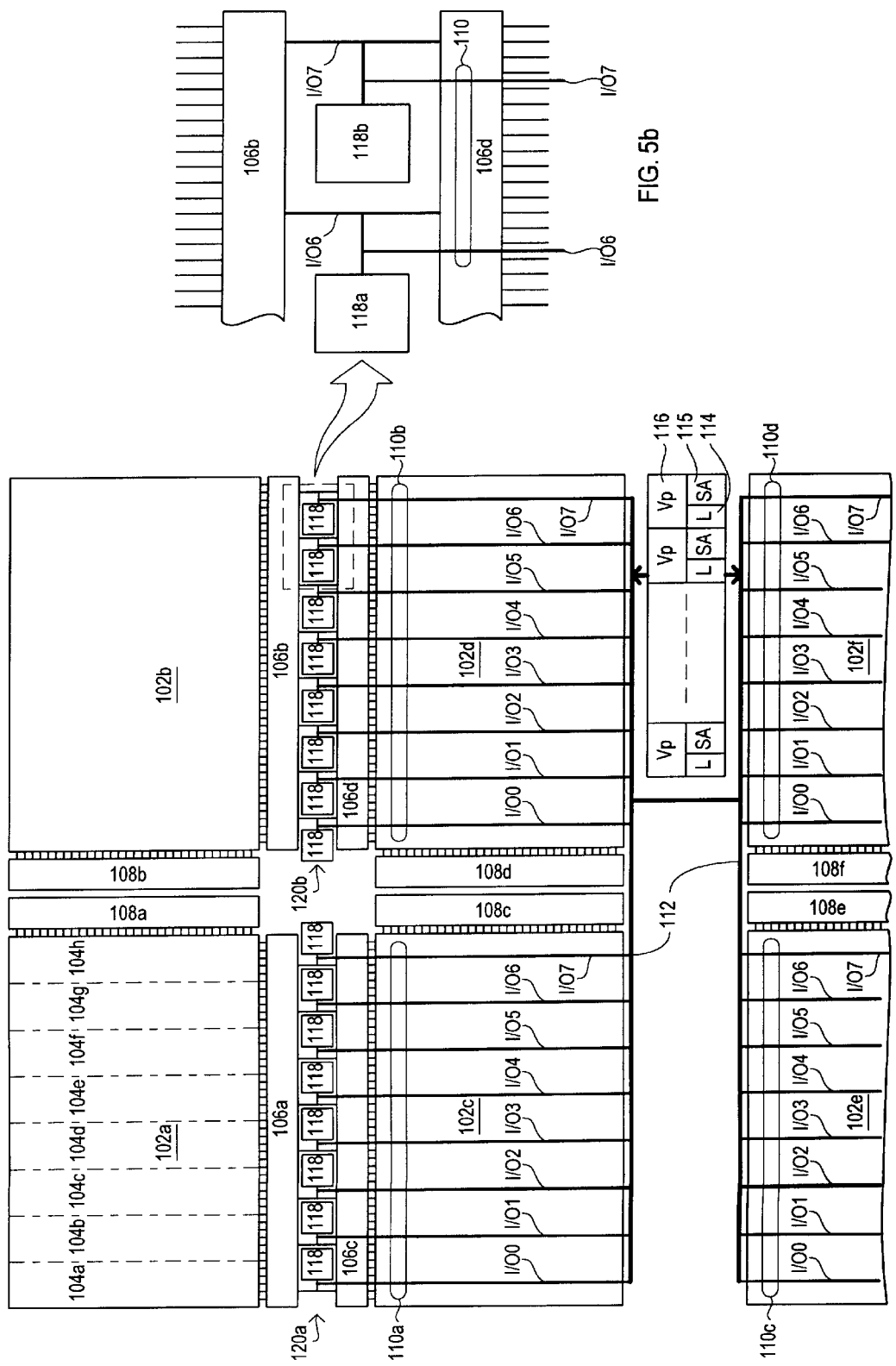
FIGS. 5a and 5b are block diagrams illustrating an EPROM device according to a preferred embodiment of the present invention.

Referring now to FIG. 5b, a portion of the memory device 100 is set forth in detail. Two data I/O lines (I/O6 and I/O7) are shown coupled to secondary load circuits 118a and 118b, respectively. This arrangement is to illustrate that, in the preferred embodiment, secondary load circuits 118 drive bit lines in opposing arrays (arrays 102b and 102d). It is understood that secondary load circuits 118 could be dedicated to single arrays, or more than two arrays. Further, more than one secondary load circuit 118 could be associated with a given data line. For example, in the event more arrays were added to the memory device 100, such that the data I/O lines 110a–110b would extend over arrays 102a and 102b, it could be advantageous to include additional secondary load circuits proximate to the additional arrays.

Figure 3:
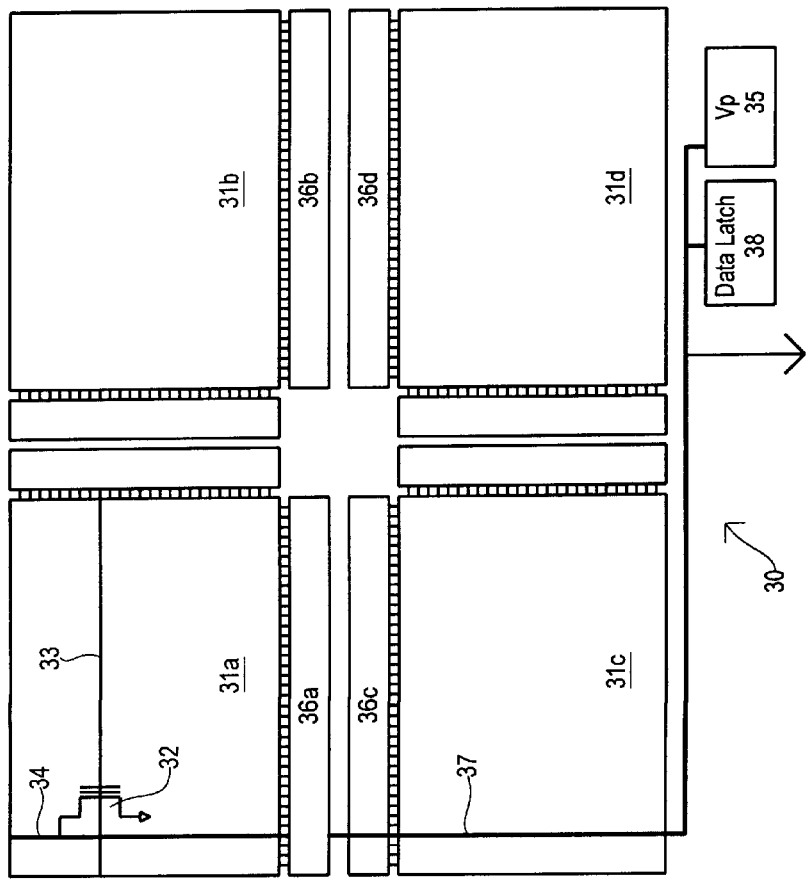
FIG. 3 is a block diagram illustrating a portion of a prior art EPROM memory device.
Figures 6A, 6B:
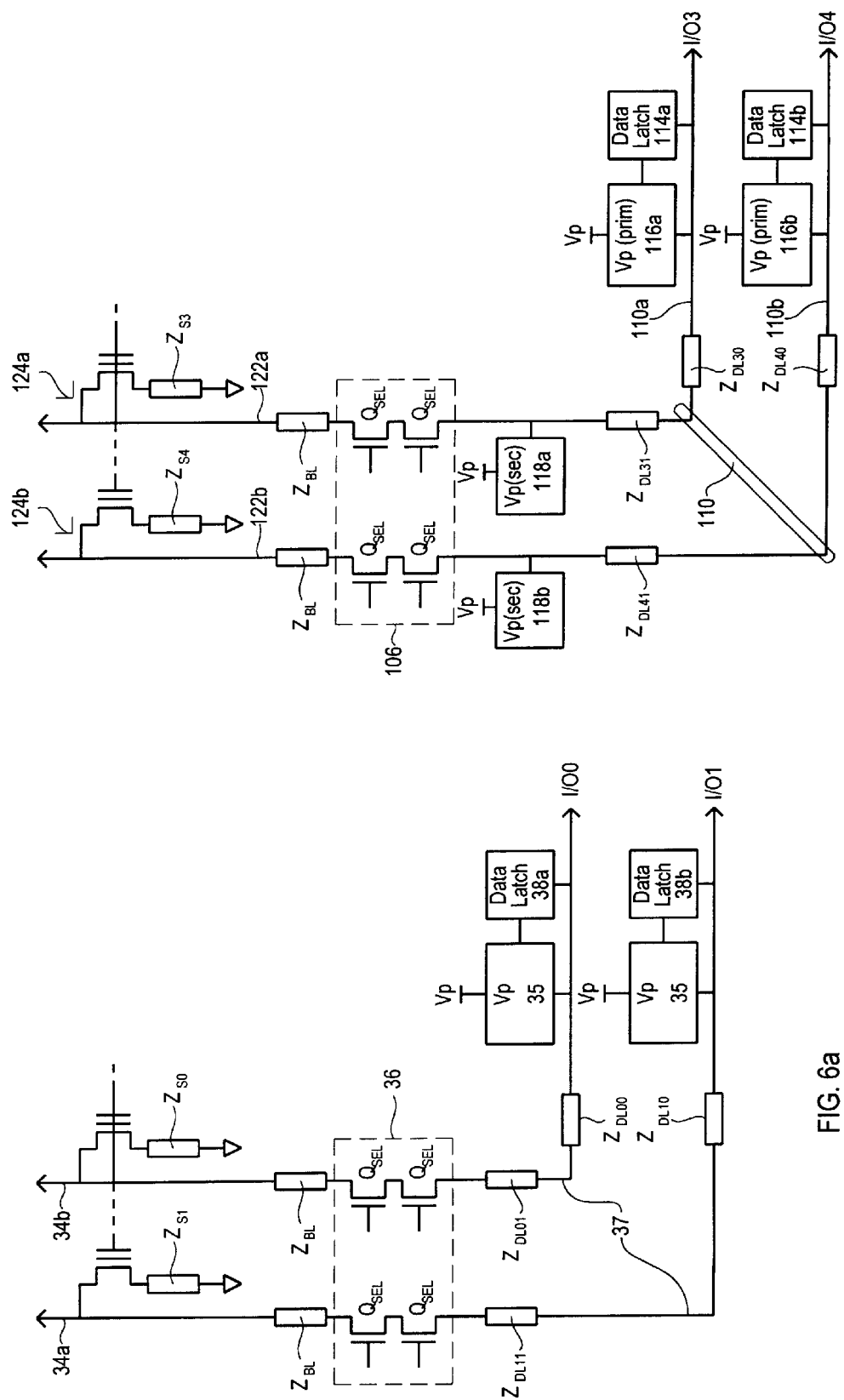
FIG. 6a is a block schematic diagram illustrating a prior art EPROM programming circuit.
FIG. 6b is a block schematic diagram illustrating a programming circuit according to a preferred embodiment.

Referring now to FIGS. 6a and 6b, two block schematic diagrams are set forth illustrating the operation of the preferred embodiment of the present invention. FIG. 6a illustrates the load line arrangement of the prior art memory device set forth in FIG. 3. Program voltage supply circuits drive data I/O lines according to data values stored in input data value stores Two such I/O lines (labelled I/O0 and I/O1) are set forth, with their associated program voltage supply circuits (35a and 35b) and data latches (38a and 38b). In the event data latch 38a is storing a logical "0" value, the program voltage supply 35a will drive I/O0 to Vp. In the event data latch 38a is storing a logical "1" value, the program voltage supply 35a will drive I/O0 to zero volts. The impedance of the program voltage path is shown by the inherent impedance of the data lines 37 (shown as $Z_{DL00}$–$Z_{DL11}$), the impedance in the column selector 36 active devices (shown as $Q_{SEL}$), and the impedance of the bit lines $Z_{BL}$. The inherent impedance of the source-to-ground path for the memory cells is also set forth (shown as $Z_{S0}$ and $Z_{S1}$). These impedance values place limits on the programming of the device. Further, variations in line impedance can create variations in programming response between cells (i.e., if $Z_{DL00}$+$Z_{DL01}$ varies significantly from $Z_{DL10}$+$Z_{DL11}$).

Referring now to FIG. 6b, a block schematic representation of a preferred embodiment is illustrated. FIG. 6b sets forth a the primary load circuits 116a–116b and data latches 114a–114b for I/O3 and I/O4 (110a and 110b). The data latches 114a–114b provide the input data values to the primary load circuits 116a and 116b, which in turn, drive the I/O lines 110a–110b to an appropriate voltage level (Vp or 0). The inherent impedance of the I/O lines 110a–110b are represented by $Z_{DL30}$–$Z_{DL41}$. Coupled to the I/O lines 110a–110b, situated between the majority of the data line impedance and the column selector, are secondary load circuits 118a and 118b. The secondary load circuits 118a and 118b drive their respective I/O lines 110a–110b in conjunction with the primary load circuits 116a–116b to limit the effect of load line impedance. For example, in the event the data latch associated with I/O3 (114a) indicates that a logical "0" value was to be written, the primary load circuit associated with I/O3 (116a) would couple I/O3 to Vp. As the voltage level on I/O3 rises, the secondary load circuit associated with I/O3 (118a) would be activated, and would also drive I/O3 to Vp. This programming voltage is applied through column selector 106, along bit line 122a, to the drain of the memory cell to be programmed 124a. The turning on of the secondary load circuit (118a or 118b) greatly reduces the effects of line impedance between the column selector 106 and its associated primary load circuit (116a or 116b) (represented by $Z_{DL30}$ and $Z_{DL31}$). It is noted that while the preferred embodiment situates the secondary load circuits 118a and 118b proximate to the column selectors 106, this should not be construed as limiting the invention thereto. Alternate embodiments could place such secondary load circuits at other locations along the data I/O line path. Further, as mentioned previously, multiple secondary load circuits could drive a single I/O line. It is also noted that the inclusion of the secondary load circuits is also advantageous for multi-bit programming, which is often utilized in test modes.

FIG. 7 sets forth a schematic diagram of a primary load circuit 116 according to a preferred embodiment. The primary load circuit 116 receives a primary load circuit enable input signal (/EN_prim), a data value input signal (DATA), and an I/O line discharge signal (DIS). A low /EN_Prim signal indicates the primary load circuit 116 is enabled. A low DATA signal indicates that the cell is to be written to, by driving the I/O line to a high voltage level. In response to the three input signals (/EN_prim, DATA and DIS) the primary load circuit 116 couples its associated I/O line (shown as "I/O") to either Vp or ground (zero volts). It is noted that an alternate embodiment of the program load circuit 116 could exclude devices $N_{P4}$ and $N_{P5}$. For example, in the event it was desirable to reduce the die area consumed by the primary load circuits.

A secondary load circuit 118 according to a preferred embodiment, is set forth in the schematic diagram of FIG. 8. Each secondary load circuit 118 receives a secondary load circuit enable signal (/EN_sec) and the I/O line potential as inputs. A low /EN_sec signal indicates the secondary load circuit 118 is enabled. In response to the /EN_sec signal, and the potential at I/O, the secondary load circuit 118 drives the I/O line to Vp or maintains the I/O line at its current potential. For example, maintains I/O at ground if the I/O has been driven low by the primary load circuit 116.

The operation of the primary load circuit 116 of FIG. 7 and the second load line 118 of FIG. 8 is best understood with reference to FIG. 9. FIG. 9 is a timing diagram illustrating the various input signals of the circuits of FIGS. 7 and 8 during a program operation.

Referring now to FIGS. 7 and 8 in conjunction with FIG. 9, the operation of the primary load circuit 116 and secondary load circuit 118 will be described. Initially the signal "PROGRAM" is low, /EN_prim and /EN_sec are high, and DIS is low. Referring now to FIG. 7, with /EN_prim high, $N_{P0}$ is on, pulling node $0_P$ low, which turns on $P_{P1}$, pulling node $1_P$ high. This disables the Vp pull-up device $P_{P2}$, preventing the primary load circuit 116 from pulling the I/O line to Vp. In addition, with /EN_prim in a high state, $N_{P6}$ is turned on and $N_{P3}$ and $N_{P4}$ are turned off. With $N_{P3}$ and $N_{P4}$ turned off, the DATA signal (the logic value of data that is to be written) cannot affect the primary load circuit 116, because $N_{P2}$ cannot turn on $P_{P2}$, and $N_{P5}$ cannot pull I/O to ground.

Referring now to the secondary load circuit 116 in FIG. 8, in a similar fashion to the primary load circuit 116, with /EN_sec high, $N_{S0}$ is turned on, node $0_S$ is low, $P_{S1}$ is on, and node $1_S$ high. With node $1_S$ high, $P_{S2}$ is disabled, preventing the secondary load circuit 118 from pulling its respective I/O to Vp. This arrangement allows the I/O lines to be maintained at a precharged state, and/or, prevents the program load line circuits (116 and 118) from affecting the operation of the memory device in modes other than programming (e.g., erase and read).

As set forth in FIG. 9, at the start of a program operation, PROGRAM transitions from low to high. Following this initial transition, /EN_prim transitions from high to low, and the program voltages begin to be applied to the I/O lines. The case of DATA high (indicating the cell is not to be programmed), will now be described. Referring to FIG. 7, once /EN_prim goes low, $N_{P0}$ is turned off, $N_{P3}$ and $N_{P4}$ are turned on, and $N_{P6}$ is turned off. With DATA high, $N_{P1}$ is turned on, pulling node $0_P$ low, which turns on $P_{P1}$. With $P_{P1}$ on, node $1_P$ is pulled to Vp. $N_{P2}$ is also off, preventing node $1_P$ from going low. This ensures that $P_{P2}$ is turned off, preventing the I/O line from being driven to the programming voltage. At the same time with DATA high, $N_{P5}$ is turned on. Because $N_{P4}$ is also on (due to /EN_prim being high) I/O is pulled to ground. As set forth in FIG. 9, following the high-to-low transition of /EN_prim, in a preferred embodiment, /EN_sec also transitions from high to low. The delays (shown as "d" in FIG. 9) between /EN_prim and /EN_sec, prevents the false triggering of the secondary load circuit 118 due to spurious voltage levels ("glitches") on the I/O line. It is noted that if the memory device could operate so that the I/O lines were glitch free, the delay between /EN_prim and /EN_sec could be eliminated. (The case of a zero delay between /EN_prim and /EN sec is shown as the dashed portion of the /EN_sec signal in FIG. 9.) Once /EN_sec goes low, $N_{S0}$ is turned off, and $N_{S3}$ is turned on. I/O is going low due to the operation of the primary load circuit 116, as previously described. With I/O going low, $N_{S2}$ remains off, and the secondary load circuit 118 does not effect the voltage levels on the I/O line. It is noted that the cross-coupled arrangement of $P_{S0}$, $P_{S1}$ and $N_{S1}$ maintains node $1_S$ in a high state, ensuring that $P_{S2}$ remains off. Thus, I/O is driven to ground by the primary load circuit 116, and this potential is applied through the column selector 106, along bit line 122 to the memory cell 124.

The case of DATA low (indicating the cell is to be programmed) will now be described. Referring now to FIG. 7, with /EN_prim low, and DATA low, $N_{P0}$ is turned off and $N_{P1}$ is turned off. $N_{P5}$ and $N_{P6}$ are also off, isolating I/O from ground. $N_{P2}$ and $NP_3$ are turned on, pulling node $1_P$ low. This turns on $P_{P0}$, which turns off $P_{P1}$, due to the cross-coupled arrangement of the two transistors. With node $1_P$ low, pull up transistor $P_{P2}$ is turned on, which couples I/O to the programming voltage Vp. In this manner, the I/O line is initially driven to the programming voltage.

Referring now to FIG. 8, following the delay "d" of the preferred embodiment, /EN_sec goes low, and $N_{S0}$ and $N_{S3}$ of the secondary load circuit 118 are turned off and on, respectively. With $N_{S3}$ on (and I/O high, due to the operation of the primary load circuit 116), $N_{S2}$ is turned on, pulling node Is to ground, via $N_{S3}$. As node $1_S$ goes low, $P_{S0}$ is turned on, pulling node $0_S$ high. Due to the cross coupled arrangement of $P_{S0}$ and $P_{S1}$, $P_{S1}$ is turned off. The low potential at node $1_S$ turns on $P_{S2}$, and the secondary load circuit 118 is triggered, pulling I/O to Vp in conjunction with the operation of the primary load circuit 116.

The program cycle concludes with /EN_prim and /EN_sec going high, and DIS pulsing high. With /EN_prim and /EN_sec high, both the primary and secondary load circuits (116 and 118) are disabled, as previously described. Further, the DIS pulse turns on $N_{P7}$ in the primary load circuit 116, and because $N_{P6}$ is also on, I/O is discharged to ground.

It is understood that the embodiments set forth herein are only some of the possible embodiments of the present invention, and that the invention may be changed, and other embodiments derived, without departing from the spirit and scope of the invention. Accordingly, the invention is intended to be limited only by the appended claims.

What is claimed is:

1. A non-volatile memory device, comprising
   a plurality of memory cell arrays, each memory cell array including a plurality of electrically programmable non-volatile memory cells arranged in rows and columns, each memory cell having a terminal for receiving a programming voltage in a programming mode to place the non-volatile memory in a first state, the terminals of memory cells in the same column within an array being commonly coupled to at least one bit line;
   a selector associated with each array, each said selector coupling a bit line of its associated array to a data line;
   a primary voltage supply circuit for selectively providing the programming voltage to the data line in the programming mode;
   at least one secondary voltage supply circuit associated with the data line, the secondary voltage supply circuit providing the programming voltage to the data line in conjunction with said primary voltage supply circuit providing the programming voltage to the data line.

2. The non-volatile memory device of claim 1, wherein:
   each electrically programmable non-volatile memory cell is a one-transistor electrically programmable read only memory cell.

3. A non-volatile memory device, comprising
   a plurality of memory cell arrays, each memory cell array including a plurality electrically programmable non-volatile memory cells arranged in rows and columns, each memory cell having a terminal for receiving a predetermined voltage in a first mode to place the non-volatile memory in a first state, the terminals of memory cells in the same column within an array being commonly coupled to at least one bit line;
   a selector associated with each array, each said selector coupling a bit line of its associated array to a data line;
   a primary voltage supply circuit for selectively providing a predetermined voltage to the data line in the first mode;
   at least one secondary voltage supply circuit associated with the data line, the secondary voltage supply circuit providing the predetermined voltage to the data line in conjunction with said primary voltage supply circuit providing the predetermined voltage to the data line, and wherein the secondary voltage supply circuit provides the predetermined voltage to the data line in response to at least the voltage level on the data line.

4. The non-volatile memory device of claim 3, wherein:
the primary voltage supply circuit provides the predetermined voltage to the data line in response to at least one input data value.

5. The non-volatile memory device of claim 3, wherein:
the primary voltage supply circuit provides the predetermined voltage to data line in response to at least one primary enable signal.

6. The non-volatile memory device of claim 3, wherein:
the secondary voltage supply circuit provides the predetermined voltage to the data line in response to at least one secondary enable signal.

7. The non-volatile memory device of claim 6, wherein:
the primary voltage supply circuit provides the predetermined voltage to the data line in response to at least one primary enable signal that precedes the secondary enable signal.

8. In a non-volatile memory device having a plurality of memory cells, each memory cell being programmed by applying a program voltage to at least one terminal of the memory cell, a programming architecture, comprising:
a plurality of data input/output (I/O) lines;
a first program load circuit responsive to input data values for coupling selected data I/O, lines to a program voltage; and
a second program load circuit associated with at least one of said data I/O lines for coupling its respective data I/O line to the program voltage in response to the first program load line circuit coupling said data I/O line to the programming voltage.

9. The programming architecture of claim 8, wherein:
the non-volatile memory device receives a positive power supply voltage; and
the program voltage is equivalent the positive power supply voltage.

10. An electrically programmable read-only memory device (EPROM), comprising:
at least one memory cell array;
means for coupling selected memory cells of said memory cell array to a plurality of programming lines;
primary programming means for driving selected programming lines to a programming voltage in response to input data write values; and
secondary programming means for coupling programming lines to the programming voltage in response to the programming lines being driven to the programming voltage by said primary program means.

11. The EPROM of claim 10, wherein:
said EPROM includes a plurality of memory cell arrays;
said means for coupling couples selected memory cells of selected arrays to the plurality of programming lines; and
said secondary programming means are proximate each memory cell array.

12. The EPROM of claim 10, wherein:
said memory cell array includes memory cells arranged in rows and columns, a plurality of memory cells in a given column being coupled to a bit line; and
said means for coupling includes a column selector for coupling selected bit lines to the plurality of programming lines.

13. The EPROM of claim 10, wherein:
said primary programming means includes program voltage coupling means associated with each data line for coupling the data line to the programming voltage in response to an input data write value and a primary enable signal.

14. The EPROM of claim 10, wherein:
said secondary programming means includes detect means for detecting the voltage level on each programming line.

15. A non-volatile memory device, comprising
a plurality of memory cell arrays, each memory cell array including a plurality electrically programmable non-volatile memory cells arranged in rows and columns, each memory cell having a terminal for receiving a predetermined voltage in a first mode to place the non-volatile memory in a first state, the terminals of memory cells in the same column within an array being commonly coupled to at least one bit line;
a selector associated with each array, each said selector coupling a bit line of its associated array to a data line;
a primary voltage supply circuit for selectively providing a predetermined voltage to the data line in the first mode;
at least one secondary voltage supply circuit associated with the data line, the secondary voltage supply circuit providing the predetermined voltage to the data line in conjunction with said primary voltage supply circuit providing the predetermined voltage to the data line, and wherein
the memory cells in each memory cell array are divided into a number of input/output (I/O) groups;
a data line is associated with each I/O group; and
a second voltage supply circuit is coupled to each data line.

16. In a non-volatile memory device having a plurality of memory cells, each memory cell being programmed by applying a program voltage to at least one terminal of the memory cell, a programming architecture, comprising:
a plurality of data input/output (I/O) lines;
a first program load circuit responsive to input data values for coupling selected data I/O lines to a program voltage; and
a second program load circuit associated with at least one of said data I/O lines for coupling its respective data I/O line to the program voltage in response to the first program load line circuit coupling said data I/O line to the programming voltage, and wherein
said first program load circuit couples selected data I/O lines to the program voltage when in an enabled state, said first program load circuit being placed in an enabled state by a primary enable signal.

17. In a non-volatile memory device having a plurality of memory cells, each memory cell being programmed by applying a program voltage to at least one terminal of the memory cell, a programming architecture, comprising:
a plurality of data input/output (I/O) lines;
a first program load circuit responsive to input data values for coupling selected data I/O lines to a program voltage; and
a second program load circuit associated with at least one of said data I/O lines for coupling its respective data I/O line to the program voltage in response to the first program load line circuit coupling said data I/O line to the programming voltage, and wherein
said second program load circuit coupling its respective data I/O line to the program voltage when in an enabled state, said second program load circuit being placed in an enabled state by a secondary enable signal that is delayed with respect to the first enable signal.

18. In a non-volatile memory device having a plurality of memory cells, each memory cell being programmed by applying a program voltage to at least one terminal of the memory cell, a programming architecture, comprising:

a plurality of data input/output (I/O) lines;

a first program load circuit responsive to input data values for coupling selected data I/O lines to a program voltage; and a second program load circuit associated with at least one of said data I/O lines for coupling its respective data I/O line to the program voltage in response to the first program load line circuit coupling said data I/O line to the programming voltage, and wherein said first program load circuit includes a primary program voltage node for supplying the program voltage, and a primary pull-up device for each data I/O line, each primary pull-up device being responsive to a data input value; and said second program load circuits each include a secondary program voltage node for supplying the program voltage, and a secondary pull-up device responsive to the voltage level on its associated data I/O line of its respective second program load circuit.

19. In a non-volatile memory device having a plurality of memory cells, each memory cell being programmed by applying a program voltage to at least one terminal of the memory cell, a programming architecture, comprising:

a plurality of data input/output (I/O) lines;

a first program load circuit responsive to input data values for coupling selected data I/O lines to a program voltage; and a second program load circuit associated with at least one of said data I/O lines for coupling its respective data I/O line to the program voltage in response to the first program load line circuit coupling said data I/O line to the programming voltage, and wherein the non-volatile memory device receives a positive power supply voltage; and the program voltage is equivalent to the positive power supply voltage.

* * * * *